(12) United States Patent
Kubota et al.

(10) Patent No.: US 8,877,082 B2
(45) Date of Patent: Nov. 4, 2014

(54) METHOD OF PROCESSING SURFACE OF HIGH-PERFORMANCE MATERIALS WHICH ARE DIFFICULT TO PROCESS

(75) Inventors: Akihisa Kubota, Kumamoto (JP); Mutsumi Touge, Kumamoto (JP)

(73) Assignee: National University Corporation Kumamoto University, Kumamoto-Shi (JP)

( * ) Notice: Subject to any disclaimer, the term of this patent is extended or adjusted under 35 U.S.C. 154(b) by 3 days.

(21) Appl. No.: 13/636,265

(22) PCT Filed: Mar. 18, 2011

(86) PCT No.: PCT/JP2011/056597
§ 371 (c)(1),
(2), (4) Date: Nov. 8, 2012

(87) PCT Pub. No.: WO2011/118532
PCT Pub. Date: Sep. 29, 2011

(65) Prior Publication Data
US 2013/0196513 A1  Aug. 1, 2013

(30) Foreign Application Priority Data

Mar. 24, 2010 (JP) ................. 2010-068021

(51) Int. Cl.
| | |
|---|---|
| C03C 15/00 | (2006.01) |
| H01L 21/306 | (2006.01) |
| H01L 21/02 | (2006.01) |
| B24B 37/04 | (2012.01) |
| H01L 29/16 | (2006.01) |
| H01L 29/20 | (2006.01) |

(52) U.S. Cl.
CPC .... *H01L 21/30604* (2013.01); *H01L 21/02024* (2013.01); *B24B 37/042* (2013.01); *H01L 29/1608* (2013.01); *H01L 29/2003* (2013.01)
USPC ........... 216/87; 216/37; 216/67; 252/79.1; 252/79.2; 252/79.3; 252/79.4

(58) Field of Classification Search
USPC ........... 216/37, 67, 87; 252/79.1–79.4
See application file for complete search history.

(56) References Cited

U.S. PATENT DOCUMENTS

| | | | |
|---|---|---|---|
| 7,585,772 B2 * | 9/2009 | Holzig et al. ............... 438/692 |
| 2005/0269577 A1 * | 12/2005 | Ueda et al. ............... 257/80 |

FOREIGN PATENT DOCUMENTS

| | | |
|---|---|---|
| JP | 2002-219635 | 8/2002 |
| JP | 2006-024910 | 1/2006 |
| JP | 2008-071857 | 3/2008 |
| JP | 2009-117782 | 5/2009 |

OTHER PUBLICATIONS

I. Yonenaga, Phyica B vol. 308-310 (2001) pp. 1150-1152.*

* cited by examiner

*Primary Examiner* — Lan Vinh
*Assistant Examiner* — Maki Angadi

(57) ABSTRACT

Disclosed is a processing method which can achieve a high processing rate, and is capable of making a surface smooth. In order to achieve this an SiC substrate is arranged in a potassium hydroxide solution containing hydrogen peroxide, and ultraviolent radiation is irradiated on the surface of the SiC substrate. An $SiO_2$ layer is formed on the surface of the SiC substrate due to the irradiation of ultraviolet radiation, and this $SiO_2$ layer is chemically removed by means of the potassium hydroxide solution, and also removed by a synthetic quartz surface plate.

11 Claims, 3 Drawing Sheets

F I G.1
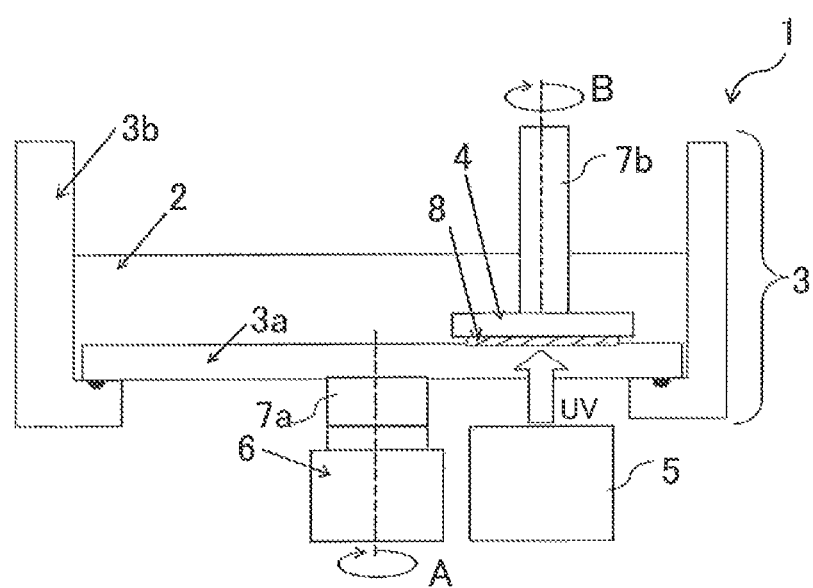

METHOD OF PROCESSING SURFACE OF HIGH-PERFORMANCE MATERIALS WHICH ARE DIFFICULT TO PROCESS

BACKGROUND OF THE INVENTION

The present invention relates to a processing method, more particularly; to a processing method which is capable of processing highly efficiently and accurately a surface of a high-performance material difficult in processing such as SiC (silicon carbide) and GaN (gallium nitride).

BACKGROUND ART

In recent years, as materials for next-generation power semi-conductor devices, attention has been given to materials such as silicon carbide (SiC), gallium nitride (GaN), diamond, sapphire and aluminum nitride (AlN) which are wide bandgap semiconductors.

For example, silicon carbide (SiC) has excellent physical values, that is, three times greater in bandgap and about seven times greater in dielectric breakdown electric-field strength than a Si semiconductor. As compared with presently available Si power devices, it is excellent in terms of low loss, high-frequency characteristics and high-temperature operability.

However, SiC is high in hardness which is next to diamond and quite stable thermally and chemically, which makes it difficult to process SiC. Thus, it is difficult to apply conventional silicon processing technologies as these are.

It is noted that conventional technologies for processing a SiC substrate include CMP (Chemical Mechanical Polishing) and high-temperature hydrogen anneal in which a substrate cut out from a single crystal of SiC is mechanically polished by using diamond grind particles to make a surface flat and an altered layer on the surface due to the processing is subsequently removed.

However, in the above-described technologies for processing a SiC substrate, a finishing surface is slightly damaged, which makes it difficult to provide a sufficient surface as a substrate for epitaxial growth. It has been, therefore, strongly demanded to develop a processing technology which is capable of providing efficiently a damage-free surface of a SiC substrate.

In accordance with the demand; there has been proposed a processing method in which a work piece is arranged in an oxidizing agent solution and constrained on a surface plate or a processing head by way of a magnetic field, magnetic fine particles of a transition metal which are spatially controlled are brought into contact with a to-be-processed surface of a work piece under extremely low loads, the to-be-processed surface and the magnetic fine particles are subjected to relative displacement, and compounds generated by chemical reactions of oxidizing active-species generated on surfaces of the magnetic fine particles with atoms on the surface of the work piece are removed or eluted through catalysis of the magnetic fine particles, by which the work piece is processed (refer to Patent Document 1, for example).

PRIOR ART DOCUMENT

Patent Document

Patent Document 1: Japanese Published Unexamined Patent Application No. 2008-71857

SUMMARY OF THE INVENTION

However, the technology described in Patent Document 1 does not provide a sufficient processing rate, and another improvement in processing rate has been demanded.

The present invention has been made in view of the above situation of an object thereof is to provide a processing method capable of achieving a high processing rate.

Means for Solving the Problem

In order to achieve the above object, the processing method of the present invention includes a step in which on a surface of a work piece arranged in an alkaline solution, light having energy greater than a bandgap of the work piece is irradiated, and also in a state that a processing member is kept in contact with the surface of the work piece on which the light has been irradiated, the work piece and the processing member are subjected to relative displacement.

In this instance, the light having energy greater than the bandgap of the work piece is irradiated to excite the surface of the work piece, thus making it possible to induce oxidation/reduction reactions on the surface of the work piece. Then, oxidation/reduction reactions rake place on the surface of the work piece, by which the surface of the work piece can be modified to form a layer softer than a base material. For example, where the work piece is a SiC substrate, a SiOx layer can be formed as a layer softer than the work piece. Where the work piece is a GaN substrate, a $Ga_2O_3$ layer can be formed as a soft layer.

Furthermore, a work piece is arranged in an alkaline solution, thus making it possible to chemically remove a soft layer formed oil the surface of the work piece. Still furthermore, in a state that a processing member is kept in contact with the surface of the work, piece, the work piece and the processing member are subjected to relative displacement, by which the soft layer formed on the surface of the work piece can be removed mechanically (physically).

That is, the soft layer formed on the surface of the work piece is, (1) chemically removed by an alkaline solution, or (2) mechanically removed by using a processing member, or (3) chemically removed by an alkaline solution and also mechanically removed by using a processing member.

Where light to be irradiated at a work piece is irradiated directly above or directly below the work piece, the light is to be irradiated evenly at the work piece. Therefore, a soft layer formed on the surface of the work piece is also formed evenly, thus making it possible to improve surface roughness at a processed area and provide a smoother processed surface.

Effects of the Invention

A processing method to which the present invention is applied is capable of achieving a high processing rate.

BRIEF DESCRIPTION OF THE DRAWINGS

FIG. 1 is a schematic diagram which explains a processing unit for carrying out one example of a processing method to which the present invention is applied;

DESCRIPTION OF THE PREFERRED EMBODIMENTS

Figure 2:
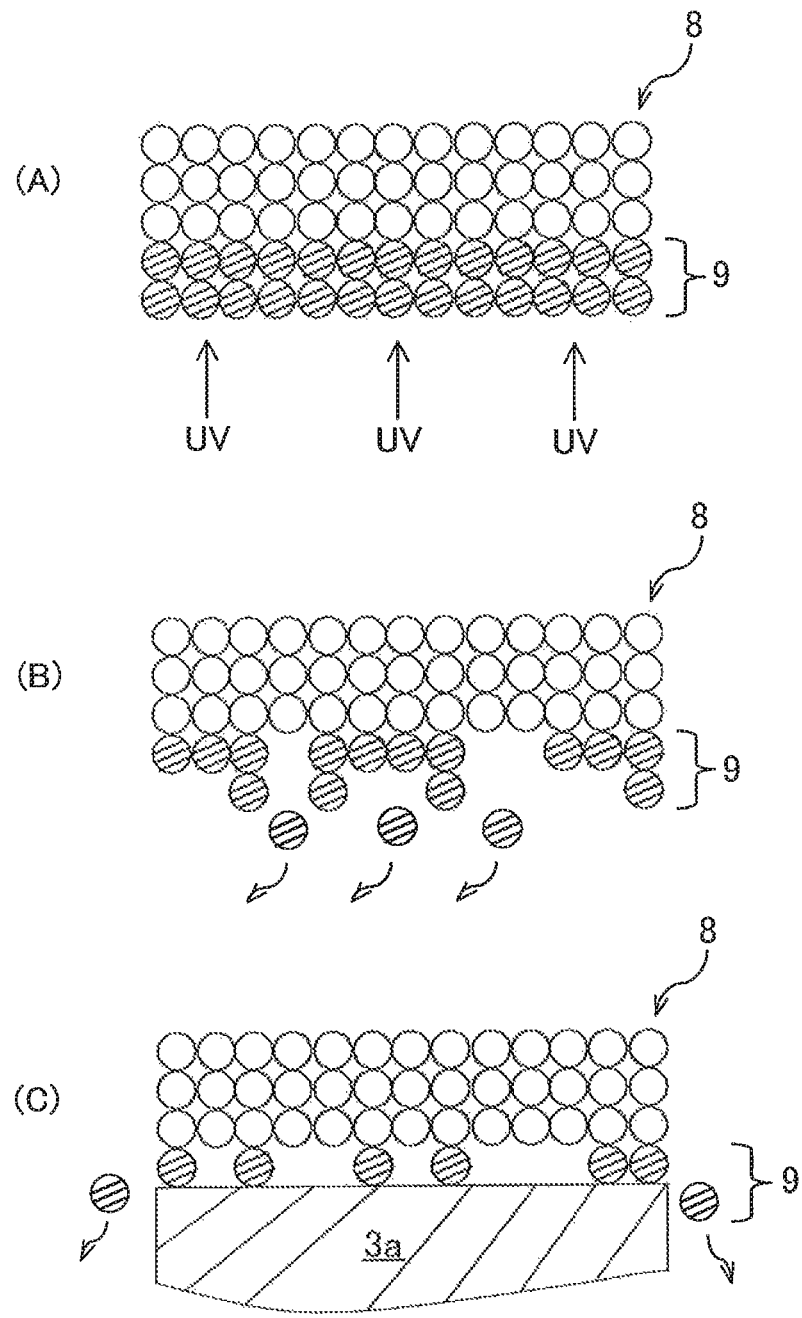
FIG. 2 is a schematic diagram which explains one example of the processing method to which the present invention is applied.

Hereinafter, an explanation will be made for modes (hereinafter, referred to as embodiments) for carrying out the present invention. The explanation will be made by the following order.
1. First embodiment
2. Second embodiment

1. First Embodiment

FIG. 1 is a schematic diagram which explains a processing unit for carrying out one example of a processing method to which the present invention is applied. The processing unit (polishing unit) 1 given here includes a processing tank 3 which contains a potassium hydroxide solution (0.1 mol/liter) 2, a sample holder 4 which holds a SiC substrate 8, and an ultraviolet light source 5 which irradiates ultraviolet light. The SiC substrate is one example of a work piece.

A bottom 3a of the processing tank 3 is composed of a synthetic quartz, surface plate, and the work piece is to be polished on an upper face (upper face in FIG. 1) of the synthetic quartz surface plate. Furthermore, a side wall 3b of the processing tank 3 is formed with a resin material excellent in drug resistance, for example, a fluororesin or a polyvinyl chloride resin. It is noted that the synthetic quartz surface plate is one example of a processing member.

Here, in the present embodiment, an explanation is made for a case where the bottom 3a of the processing tank 3 is formed with synthetic quartz, for example. However, any material will be sufficient which has such, transmittance that ultraviolet light to be irradiated from the ultraviolet light source 5 arrives at the upper face of the bottom 3a. And, the bottom 3a is not necessarily formed with synthetic quartz but may be formed with, for example, sapphire or the like.

Furthermore, the center of the synthetic quartz surface plate 3a is coupled with a rotating shaft 7a which is connected to a motor 6. The processing tank 3 is constituted so as to rotate by the motor 6 in a direction indicated with symbol A in FIG. 1.

Here, in the present embodiment, an explanation is made for a case where, as an alkaline solution to be contained in the processing tank 3, used is a potassium hydroxide (KOH) solution. However, as will be described later, any alkaline solution will, be sufficient as long as it is capable of removing chemically a modified layer portion formed on a surface of a work piece. And, the alkaline solution is not necessarily a potassium hydroxide solution but may be that which contains at least one of a potassium hydroxide (KOH) solution, a sodium hydroxide (NaOK) solution, an alkaline electrolyte and a calcium hydroxide ($Ca(OH)_2$) solution. That is, the alkaline solution may be replaced with various materials depending on a combination of a work piece, processing conditions, etc.

Furthermore, the sample holder 4 is constituted so as to rotate in a direction indicated by symbol B in FIG. 1 at the center of a rotating shaft 7b which is made eccentric to the rotating shaft 7a of the processing tank 3. The sample holder 4 comes down from above to a position at which the SiC substrate 8 and the synthetic quartz surface plate 3a are in contact with each other, with the SiC substrate 8 being held.

Here, in the present embodiment, an explanation is made for a case where the SiC substrate 6 is taken as a work piece held with the sample holder 4. However, the work piece shall not be limited to the SiC substrate but may include a substrate composed of, for example, silicon nitride, GaN, diamond, sapphire or AlN.

Furthermore, the ultraviolet light source 5 is constituted so as to irradiate ultraviolet light on the upper face of the synthetic quartz surface plate 3a. That is, it is constituted so that ultraviolet light can be irradiated at an area where the SiC substrate 6 and the synthetic quartz surface plate 3a are in contact with each other. It is noted that the ultraviolet light source 5 is arranged directly below the area where the SiC substrate 8 and the synthetic quarts surface plate 3a are in contact, with each other and constituted so as to irradiate ultraviolet light directly above from the ultraviolet light source 5.

Here, as long as ultraviolet light can be irradiated at the area where the SiC substrate 8 and the synthetic quarts surface plate 3a are in contact with each other, the ultraviolet light source 5 is not necessarily arranged directly below the area where the SiC substrate 8 and the synthetic quartz surface plate 3a are in contact with each other. However, the ultraviolet light source Sis arranged directly below the area where the SiC substrate 8 and the synthetic quartz surface plate 3a are in contact with each other in such a mariner that the ultraviolet light can be irradiated directly above. Thereby, it is possible to irradiate the ultraviolet light evenly at the area where the SiC substrate 8 and the synthetic quartz surface plate 3a are in contact with each other. Therefore, it is preferable that the ultraviolet light source 5 is arranged directly below the area where the SiC substrate 8 and the synthetic quartz surface plate 3a are in contact with each other.

In the present embodiment, an explanation is made for a case where light irradiated at the SiC substrate 8 is ultraviolet light. However, any light will be sufficient as long as it has energy greater than a bandgap of the SiC substrate 8.

Hereinafter, an explanation will be made for a processing method in which the above-constituted processing unit 1 is used. That is, there will be explained one example of the processing method to which the present invention is applied.

First, ultraviolet light is irradiated at the SiC substrate 8, by which, as shown in FIG. 2(A), a layer 9 is formed which is softer than the SiC substrate 8. More specifically, the ultraviolet light is irradiated at the SiC substrate 8 to form the $SiO_2$ layer 9 on a surface layer of the SiC substrate 8.

That is, the ultraviolet light is irradiated at the SiC substrate 8, by which a surface of the SiC substrate 8 is excited to induce oxidation/reduction reactions on the surface of the SiC substrate 8. Then, oxidation/reduction reactions take place on the surface of the SiC substrate 8, by which the surface of the SiC substrate 8 is modified. As described, above, the soft layer ($SiO_2$ layer) 9 is formed on the surface of the SiC substrate 8.

The $SiO_2$ layer 9 formed on the surface layer of the SiC substrate 8 is removed by chemical etching actions resulting from a potassium hydroxide solution (refer to FIG. 2(B)) and also mechanically removed by the synthetic quartz surface plate 3a (refer to FIG. 2(C)).

In the processing method of the present embodiment, the soft $SiO_2$ layer 9 is formed on the surface of the SiC substrate 8 and removed chemically and mechanically. It is, thereby, possible to achieve highly efficient and highly accurate processing.

Figure 3:
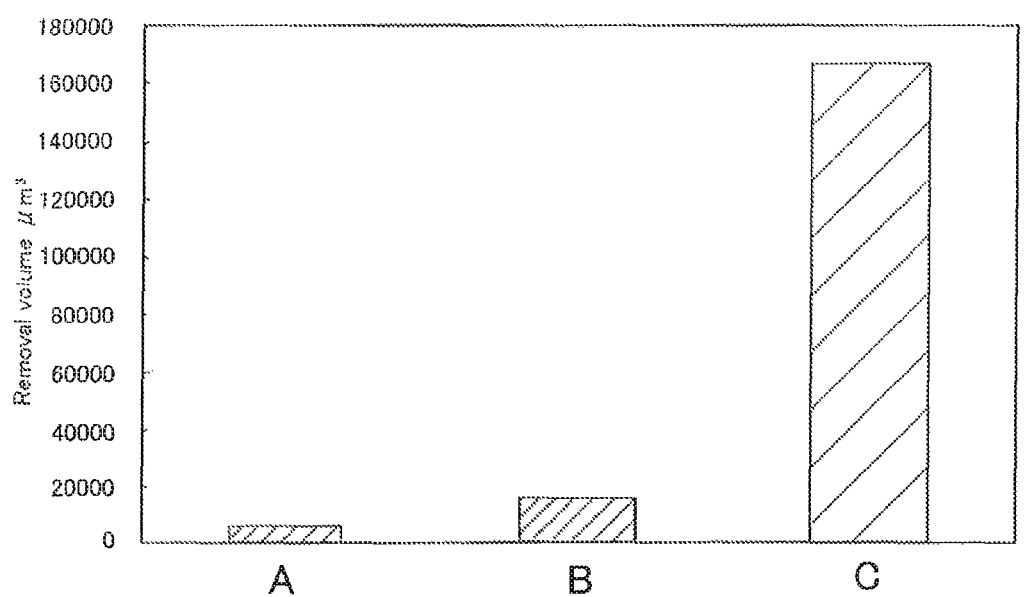
FIG. 3 is a schematic diagram which shows processing rates by various processing methods.

FIG. 3 is a schematic diagram which shows processing rates by various processing methods.

First, symbol A in FIG. 3 indicates a processing rate at which the SiC substrate is arranged in hydrogen peroxide solution ($H_2O_2$) and an iron (Fe)-made processing member is kept in contact with the SiC substrate and moved in a reciprocating manner.

That is, symbol A in FIG. 3 indicates a processing rate at which the surface of the SiC substrate is oxidized by OH radical (OH; hydroxyl radical) generated, through reactions of the processing member (Fe) with the hydrogen peroxide solution ($H_2O_2$) and oxygen dissolved in the hydrogen peroxide solution ($H_2O_2$) to form a $SiO_2$ layer and the processing member is then moved in a reciprocating manner, thereby removing the $SiO_2$ layer. This technology has been described in Patent Document 1 described above.

Furthermore, symbol B in FIG. 3 indicates a processing rate at which the SiC substrate is arranged in hydrogen peroxide solution ($H_2O_2$), ultraviolet light is irradiated at the SiC substrate, and quartz is kept in contact with the SiC substrate and moved in a reciprocating manner.

That is, symbol B in FIG. 3 indicates a processing rate at which the surface of the SiC substrate is oxidized by OH radical generated through decomposition of the hydrogen peroxide solution ($H_2O_2$) due to influences of the ultraviolet light and oxygen dissolved in the hydrogen peroxide solution ($H_2O_2$) to form a $SiO_2$ layer and the quartz is then moved in a reciprocating manner, thereby removing the $SiO_2$ layer.

On the other hand, symbol C in FIG. 3 indicates a processing rate by the processing method of the present embodiment.

As apparent from FIG. 3, the processing rate of the present embodiment is quite high.

Table 1 indicates surface roughness obtained when processing is done by the processing method of the present embodiment and surface roughness obtained when processing is done by a method similar to the processing method of the present embodiment under the same conditions except that no ultraviolet light is irradiated.

TABLE 1

| Surface roughness | Present embodiment | Commonly employed processing method |
|---|---|---|
| Maximum difference in height | 1.74 nm | 2.09 nm |
| Mean surface roughness | 0.14 nm | 0.19 nm |

As apparent from Table 1, the processing method of the present embodiment is capable of making improvements not only in processing rate but also in surface roughness.

2. Second Embodiment

In the above-described first embodiment, the $SiO_2$ layer is formed only by ultraviolet light, However, the $SiO_2$ layer may be formed by OH radical together with ultraviolet light.

That is, hydrogen peroxide solution ($H_2O_2$) may be put into the processing tank 3, together with a potassium hydroxide solution 2.

When ultraviolet light is irradiated at a solution containing hydrogen peroxide solution ($H_2O_2$), there is generated OH radical which has an extremely strong oxidizing power (refer to Formula 1).

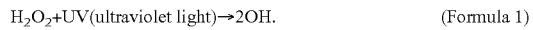
$$H_2O_2 + UV(\text{ultraviolet light}) \rightarrow 2OH. \quad \text{(Formula 1)}$$

Then, the thus generated OH radical reacts with raised portions on a surface of the SiC substrate 8, by which the surface of the SiC substrate 8 is oxidized to form the $SiO_2$ layer 9 (refer to Formula 2).

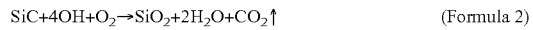
$$SiC + 4OH + O_2 \rightarrow SiO_2 + 2H_2O + CO_2\uparrow \quad \text{(Formula 2)}$$

The present embodiment is similar to the above-described first embodiment in that ultraviolet light is irradiated at the SiC substrate 8 to excite the surface of the SiC substrate 8, thereby forming the $SiO_2$ layer 9.

Then, the $SiO_2$ layer 9 formed on the surface of the SiC substrate 8 by irradiation of ultraviolet light and also by actions of OH radical is removed by chemical etching actions resulting from a potassium hydroxide solution (refer to FIG. 2(B)) and also removed mechanically by the synthetic quartz surface plate 3a (refer to FIG. 2(C)). This is also similar to the above-described first embodiment.

The processing method of the present embodiment is similar to that of the above-described first embodiment in that it is capable of achieving highly efficient and highly accurate processing and also capable of making an improvement in surface roughness.

DESCRIPTION OF SYMBOLS

1: Processing unit
2: Potassium hydroxide solution
3: Processing tank
3a: Synthetic quartz surface plate
3b: Side wall
4: Sample holder
5: Ultraviolet light source
6: Motor
7a: Rotating shaft
7b: Rotating shaft
8: SiC substrate
9: $SiO_2$ layer

What is claimed is:

1. A method of processing a surface of high-performance material work piece which is difficult to process, comprising:
   irradiating ultraviolet light, through a processing member, onto the surface of the work piece, wherein the surface is arranged in an alkaline solution, and wherein the ultraviolet light has energy greater than a bandgap of the work piece being irradiated; and
   contacting the surface of the work piece with a processing member consisting of a synthetic quartz or sapphire; and
   during said irradiating, subjecting the surface and the processing member to relative displacement while in contact; and
   wherein the ultraviolet light is irradiated at the work piece surface via the processing member.

2. The processing method according to claim 1, wherein the alkaline solution comprises at least one of a potassium hydroxide solution, a sodium hydroxide solution, an alkaline electrolyte and a calcium hydroxide solution.

3. The processing method according to claim 2, wherein the work piece comprises any one of silicon carbide, silicon nitride, GaN, diamond, sapphire and AlN.

4. The processing method according to claim 3, further comprising after said irradiating subjecting the surface and the processing member to relative displacement while in contact.

5. The processing method according to claim 2, further comprising after said irradiating subjecting the surface and the processing member to relative displacement while in contact.

6. The processing method according to claim 1, wherein the work piece comprises any one of silicon carbide, silicon nitride, GaN, diamond, sapphire and AlN.

7. The processing method according to claim 6, further comprising after said irradiating subjecting the surface and the processing member to relative displacement while in contact.

8. The processing method according to claim 1, further comprising after said irradiating subjecting the surface and the processing member to relative displacement while in contact.

9. A method of processing a wide bandgap semiconductor work piece having greater hardness, thermal stability and chemical stability than silicon, comprising:
- holding a surface of the work piece to be processed so as to be submerged in an alkaline solution;
- contacting the surface of the work piece with a processing member consisting of a synthetic quartz or sapphire material transmissive to ultraviolet light;
- irradiating the surface of the work piece with ultraviolet light having energy greater than a bandgap of the work piece so as to cause a reaction at the surface which softens the surface; and
- during said contacting, relatively displacing the surface and the processing member; and
- wherein during said irradiating, the ultraviolet light passes transmissively through the processing member before impinging upon said surface;
- wherein during said irradiating and said displacing, the alkaline solution acts chemically to remove softened surface material and the processing member acts mechanically to remove softened surface material.

10. The method of claim 9, wherein the alkaline solution comprises at least one of a potassium hydroxide solution, a sodium hydroxide solution, an alkaline electrolyte and a calcium hydroxide solution.

11. The method of claim 9, wherein the work piece comprises at least one of silicon carbide, silicon nitride, GaN, diamond, sapphire and AlN.

* * * * *